United States Patent [19]

Kluth et al.

[11] Patent Number: 4,682,329
[45] Date of Patent: Jul. 21, 1987

[54] TEST SYSTEM PROVIDING TESTING SITES FOR LOGIC CIRCUITS

[76] Inventors: Daniel J. Kluth, 9767 Union Terrance La., Maplegrove, Minn. 55369; Gary L. Engel, 21299 Viking Blvd., Wyoming, Minn. 55092

[21] Appl. No.: 717,077

[22] Filed: Mar. 28, 1985

[51] Int. Cl.[4] ............................................. G06F 11/00
[52] U.S. Cl. ....................................... 371/15; 391/25; 324/73 R
[58] Field of Search ....................... 371/15, 23, 24, 25, 371/27; 324/73 R

[56] References Cited

U.S. PATENT DOCUMENTS

| | | |
|---|---|---|
| 3,761,695 | 9/1973 | Eichelberger ........................ 371/25 |
| 3,783,254 | 1/1974 | Eichelberger . | |
| 4,225,958 | 9/1980 | Funatsu ................................. 371/15 |
| 4,293,919 | 10/1981 | Dasgupta . | |
| 4,308,616 | 12/1981 | Timoc .................................... 371/23 |
| 4,534,028 | 8/1985 | Trischler ............................... 371/25 |
| 4,566,104 | 1/1986 | Bradshaw .............................. 371/15 |

OTHER PUBLICATIONS

L. A. Stolte, "Design for Testability of the IBM System/38", Proc. No. 20th, IEEE Test Conference, 10/1979, pp. 29-36.
E. I. Muehldorf, "Designing LSI Logic for Testability", Proc. No. 7th, Semiconductor Test Conference, 10/1976, pp. 45-49.
S. Dasgupta, "Mult-Function Latch for Shift Register . . . ", IBM Tech. Bulletin, vol. 21, No. 9, 2/1979, pp. 3646-3648.
S. Funatsu, "Designing Digital Circuits with Easily . . . ", IEEE, 2/1978, pp. 98-102.
E. B. Eichelberger, "A Logic Design Structure for LSI Testability", IBM, pp. 462-468.

*Primary Examiner*—Jerry Smith
*Assistant Examiner*—Robert W. Beausoliel, Jr.
*Attorney, Agent, or Firm*—Ratner & Prestia

[57] ABSTRACT

A test system for a logic circuit in which virtual pins are coupled between logical networks and in which the virtual pins are free of any logic elements in common with the networks. A single latch control line, independent of the system clock of the networks, by applying three different control signals, controls switching between a test mode and a system mode and also controls latching and storing of data from a logic network. When the latch control line switches to the system mode it maintains the system mode independently of the cycling of the system clock. Further in the system mode, the virtual pins are transparent. In the test mode a string of virtual pins form a shift register which may be used to shift a test pattern by means of separate A,B clock signals into position for testing the logic networks.

14 Claims, 4 Drawing Figures

TEST SYSTEM PROVIDING TESTING SITES FOR LOGIC CIRCUITS

BACKGROUND OF THE INVENTION

1. Field of the Invention

This invention relates to the field of semiconductor testability and in particular to the insertion of latches into a semiconductor logic circuit to provide testing sites.

2. Background Art

It is well known that after digital logic circuits are manufactured, it is necessary to test the circuits for reliability. Prior to the type of testing called scan/set testing, digital logic networks were testable using only real edge pins. The real inputs were given logical values, and the logical functioning of the digital network was simulated with software to determine the proper output logic values.

During this simulation, digital logic failures were modeled to emulate the conditions of real hardware failures which may later be detected during testing of the logic networks. This was called fault simulation. Fault simulation was a complicated and time-consuming process. The ability of a software simulation to emulate a faulty network has depended upon both the overall size of the logical network being simulated and the number of buried sequential latches within the network. Buried sequential latches are latches whose inputs and outputs are not connected to any real edge pins.

In testing using fault simulation, all of the functions which the circuit was designed to perform were exercised to determine whether they operated properly. However, this method of testing may leave areas of a circuit untested and thus, not observable. The problem of lack of observability within circuits has increased with the greatly increased density of logic circuitry. As density increased, the number of internal logic elements per external pin increased, making it more difficult to properly simulate network faults.

It is known in the art to insert additional circuitry at a plurality of points within the circuit to be tested to serve as test sites within the circuit under test. These test sites may receive and store information from a single external pin. The stored information may be applied to the circuit under test. These sites may also receive information from the circuit under test and apply it to an external pin. Thus these sites may serve as "virtual pins" and improve testability over what was previously available using only real edge pins. U.S. Pat. No. 3,783,254 issued to Eichelberger and U.S. Pat. No. 4,293,919 issued to DasGupta teach the insertion of latches for testing purposes.

In these and similar systems, there was a partitioning of the logic circuits using inserted latches in which the inserted latches were coupled with preexisting latches and were positioned within the circuit under test in such a way as to divide the circuit under test and to form boundaries of partitions of the circuit under test. This had the dual effect of reducing the size of the logic network that was fault simulated and reducing the number of buried sequentials in the logic network. The size of the logic network was reduced because the inserted latches, coupled with the preexisting latches, served as scan/set latches and served as partitioning break points which divided a single large logic network into many smaller logic networks. The number of sequentials within the network was reduced because some of the buried sequential latches were converted to scan/set latches which fell between the partitions and were not fault simulated.

Shift registers were then formed by joining the inserted scan/set latches together. Scan data was shifted through the shift registers to apply test data to predetermined sites in the logic circuits under test. Additionally, data from the logic circuits could be latched into the shift registers. This data which was received from the logic circuits into the registers was shifted through the registers to a dedicated external output pin where it could be analyzed for fault diagnosis. *Design for Testability of the IBM System /38* by L. A. Stolte, Proc. 20th IEEE Test Conference, October, 1979 and *Designing LSI Logic for Testability* by E. I. Muehldorf, Proc. 7th Semiconductor Test Conference, October, 1976 describe this type of improvement in testability.

Using these methods, many of the partitions became purely combinatorial in that they did not contain any buried sequential latches. However, not all buried sequentials were converted to scan/set latches and some of the logic partitions contained buried sequential latches.

In these prior test systems, the conventional preexisting latch was coupled to a data selector allowing the latch to accept either system data or scan/set data depending on whether the system clock or the scan/set clock was pulsed. This latch was coupled to a slave latch to create a virtual pin. These virtual pins could only be inserted at locations where the preexisting latch was present because the preexisting latch and the inserted latch operated cooperatively to form the virtual pin. Thus the number and location of virtual pins which could be inserted to test systems using this method were limited because virtual pins could be formed only where there was a preexisting latch. Consequently, the partitioning of the circuits under test was constrained because boundaries could only be formed where there were preexisting latches.

Furthermore, the operation of the virtual pin during testing of the circuit under test was partly controlled by the system clock. This resulted from the fact that one of the latches of the virtual pin, i.e. the preexisting latch, was also part of the partitioned circuit and required the system clock input for normal system functions. Thus it was not possible to use the system clock input to the existing latch completely independently.

It is therefore an object of the present invention to provide a virtual pin for testing logic circuitry which may be inserted in the quantity and at the locations required for optimum testability independently of the existing circuitry of the logic circuit to be tested.

It is a further object of the present invention to provide a virtual pin for testing logic circuitry which may be controlled during testing by signals which are independent of the system clock.

SUMMARY OF THE INVENTION

A test system for a logic circuit having a test mode and a system mode with virtual pins coupled between logical networks. The virtual pins are free of any logic elements in common with the networks. A single latch control line is independent of the system clock of the networks and provides three different control signals for switching between the test mode and the system mode and to control the latching and storing of data from a logic network. When the latch control line switches to the system mode, it maintains the system mode independently of cycling of the system clock. The virtual pins allow testing of the logic network during the test mode and are transparent when the system is in the system mode.

Because the virtual pins are free of any logic in common with the networks, they may be inserted into the logic circuit independently of preexisting circuit elements, particularly independently of the location and number of preexisting latches. Thus the logic circuit may be partitioned into networks independently of preexisting latches.

DETAILED DESCRIPTION OF THE INVENTION

Figure 1:
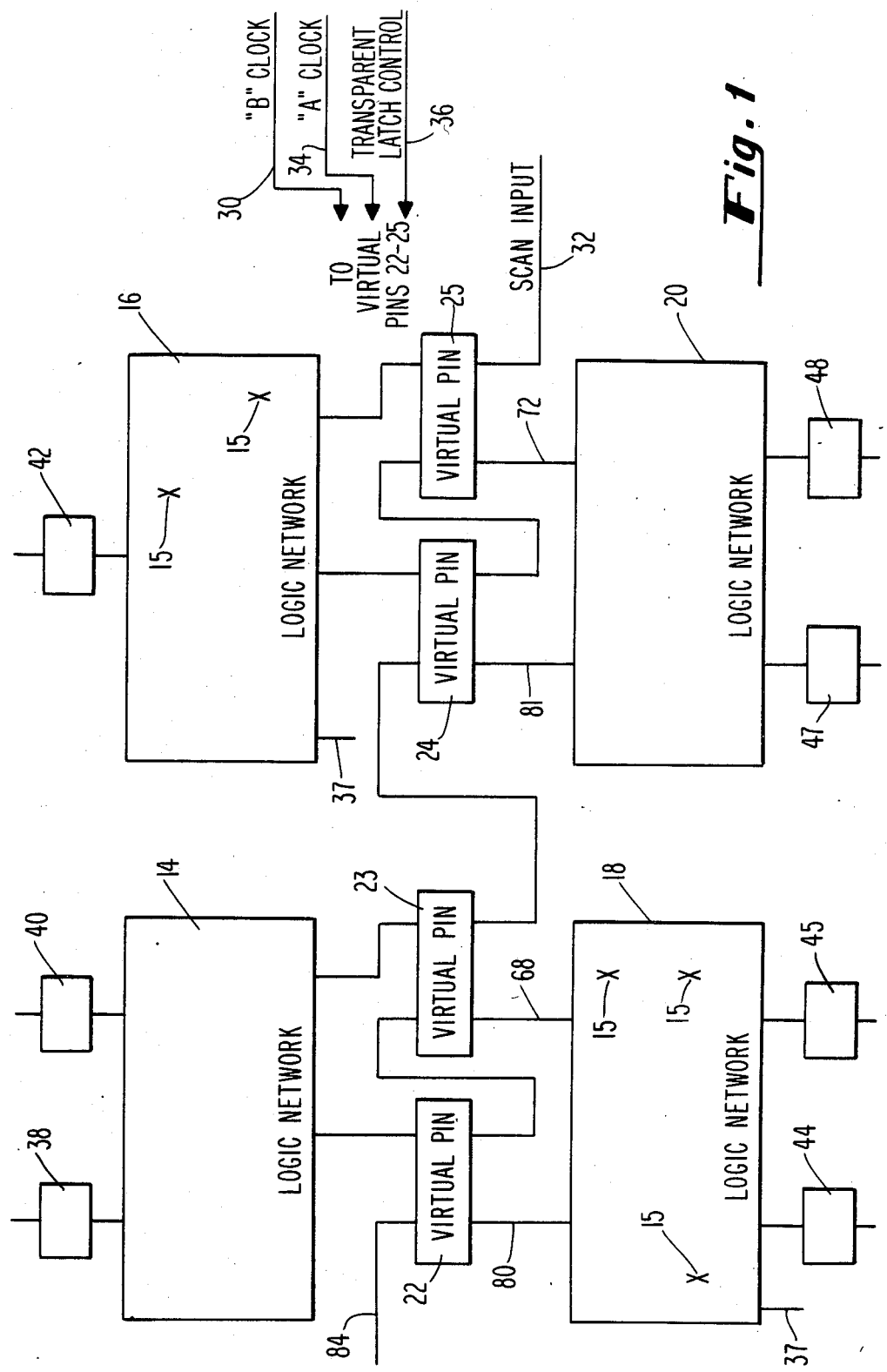
FIG. 1 shows the test system for a logic system of the present invention.
Figure 2:
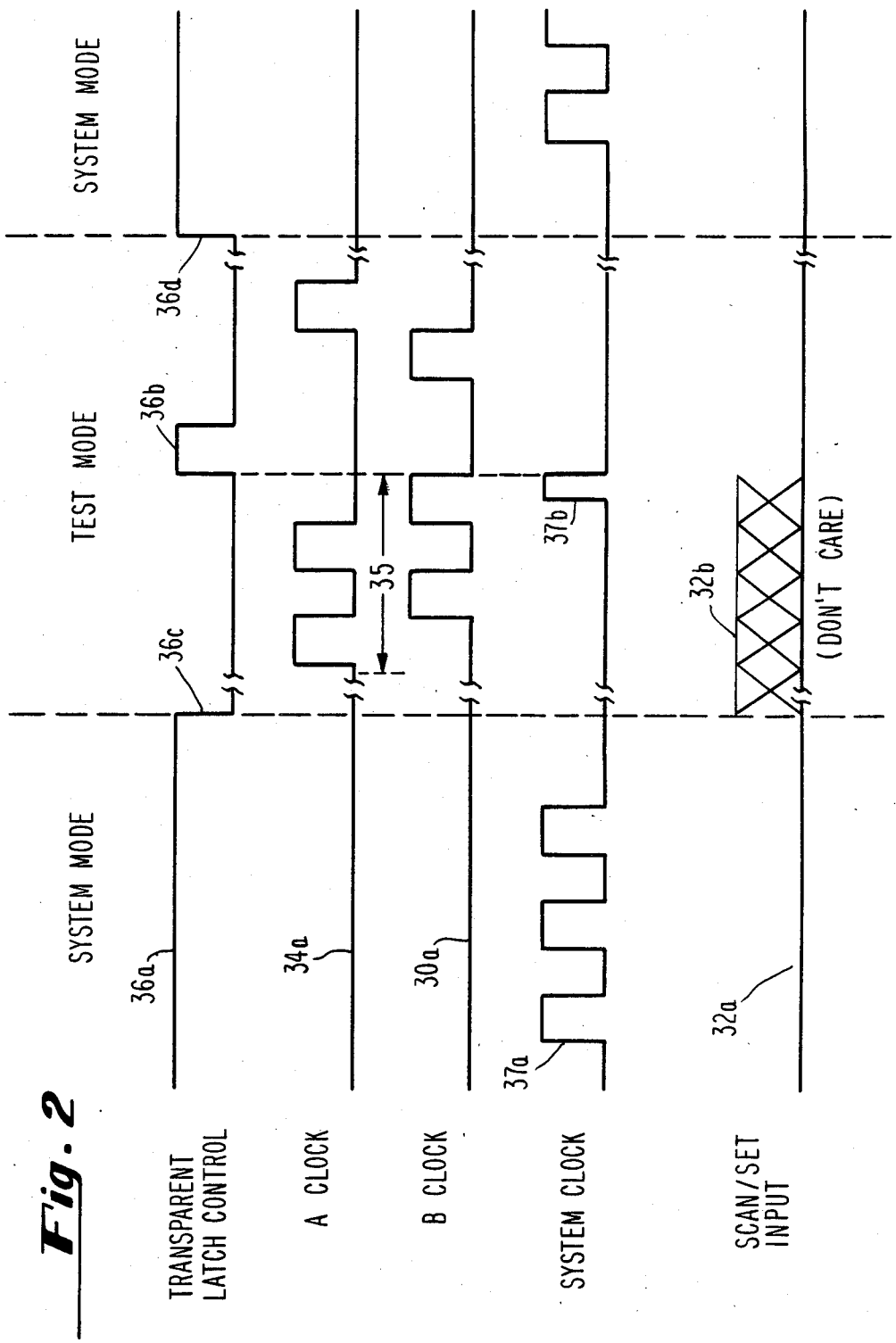
FIG. 2 shows timing diagrams of the test system of FIG. 1.

Referring now to FIGS. 1 and 2, there is shown logic networks 14, 16, 18 and 20 which are partitions of the logic within a logic circuit or system 10 and its timing diagrams. Logic system 10 is disposed within a conventional package having external metal pins (not shown). Real inputs to system 10 are received by real input pins 44, 45, 47 and 48 at the bottom of FIG. 1 and real outputs may be read at real output pins 38, 40 and 42 at the top of FIG. 1. Networks 14, 20 are purely combinatorial logic while networks 16, 18 contain buried latches 15. Because buried latches 15 are sequential logic, networks 16, 18 are clocked by a system clock signal 37a (FIG. 2) which is applied to logic networks 16, 18 by system clock line 37.

To divide logic circuit 10 under test into networks all real input/output pins are assumed to be boundaries of partitions. Virtual pins 22-25 are effectively inserted into system 10 thereby forming further boundaries of partitions. These partitions define networks 14, 16, 18 and 20. The positions of the virtual pins 22-25 are chosen to maximize testability and may vary according to the configuration of system 10. When positioning virtual pins, logic networks 14, 16, 18 and 20 may be chosen to include only combinatorial elements or a combination of combinatorial and sequential elements. These networks may contain elements such as NAND gates, buried latches and registers.

Further, networks 14, 16, 18 and 20 may not overlap with virtual pins 22-25. Each virtual pin 22-25 includes all logic elements necessary for its operation. None of these logic elements is common to any of the networks 14, 16, 18 or 20.

Real output pins 38, 40 are coupled to logic network 14 and real output pin 42 is coupled to logic network 16. Real output pins 38, 40 and 42 are electrically coupled to external pins on the exterior of the package (not shown) which contains system 10 thus allowing signals from networks 14, 16 to be read from outside the package. Logic network 18 is coupled to real input pins 44, 45 and logic network 20 is coupled to real input pins 47, 48. Real input pins 44, 45, 47 and 48 are also electrically coupled to the exterior of the chip package which contains system 10 thus allowing signals to be applied to networks 18, 20 from outside the package.

Under the control of signals shown in FIG. 2, virtual pins 22-25 may be used to test logic networks 14, 16, 18 and 20 for defects. Virtual pins 22-25 are test sites which may apply signals to networks 4, 16 or receive signals from networks 18, 20 and may communicate with external pins. For example, scan input data 32a may be received into virtual pin 25 from scan input line 32. Virtual pins 22-25 may then act as a shift register under the control of A clock 34a and B clock 30a causing scan input data 32a to be shifted in series from virtual pin 25 through virtual pins 24, 23 and 22. A predetermined test pattern may thus be applied to logic networks 14, 16 by virtual pins 22-25 in order to test logic networks 14, 16.

System 10 has two modes: a test mode and a system mode. It will be shown that system clock 37a may be used during test mode if there is buried sequential logic in system 10. In the system mode networks 14, 16, 18, 20 operate as they were designed to operate under the control of system clock signal 37a while virtual pins 22-25 are transparent and completely independent of system clock signal 37a. In the test mode networks 14, 16, 18, 20 may be tested. To switch between these modes transparent latch control line 36 is used. Line 36 is separate from and independent of system clock line 37. With a low level transition 36c of transparent latch control signal 36a on line 36, system 10 switches to the test mode and testing may be performed.

Additionally, during the test mode line 36 provides a transparent latch control pulse 36b to virtual pins 22-25 causing them to latch and store data from networks 18 and 20. This latched data is produced when a test signal is applied to real input pins 44, 45, 47, 48 and the test signal progresses through networks 18, 20 to lines 80, 68, 81 and 72. In order for the test signal to propagate through a network containing buried latches 15, such as network 18, clock pulse 37b must be applied on system clock line 37. Using A clock 34a and B clock 30a the data latched into virtual pins 22-25 may be shifted through virtual pins 22-25 in a serial manner to scan set output 84 where it may be read thereby testing logic networks 18, 20.

During the test mode and other than the time during pulse 36b, transparent latch control line 36 is low. A and B clocks 34a, 30a may be used to shift data through pins 22-25, transparent latch control line 36 may be used to switch modes or to latch data from networks 18, 20, and system clock line 37 is inactive except when clocking test signals through buried latches 15.

Because the logic elements of virtual pins 22-25 are completely independent of the logic elements of the networks, partitioning of the logic elements of system 10 may be performed independently of the logic elements of system 10. The boundaries of the partitions of system 10 are formed by inserting virtual pins. Since the virtual pins are independent of the logic elements of system 10 they may be inserted anywhere and therefore boundaries of partitions may be drawn anywhere. In particular, a boundary may be formed where there is no preexisting latch.

When a high level transition 36d of transparent latch control signal 36a occurs, system 10 switches to the system mode. In the system mode, networks 14, 16, 18, 20 function as they were designed to function and are under the control of system clock signal 37a applied by system clock line 37. Because virtual pins 22-25 are formed of level sensitive latches, they are transparent during the system mode allowing information to be transferred from networks 18, 20 to networks 14, 16. A level sensitive latch permits data to pass through when its clock signal is high and latches the last data bit on its input when its clock goes low. Thus when transparent latch control signal 36a goes high during system mode, data may ripple through virtual pins 22-25.

No signals from A or B clocks 34a, 30a or system clock 37a are applied to virtual pins 22-25 while system 10 is in the system mode. System clock 37a is applied in normal manner to networks 14, 16, 18, 20. Virtual pins 22-25 are therefore transparent under these conditions and have no effect on the operation of system 10 other than causing two gate delays.

Figure 3:
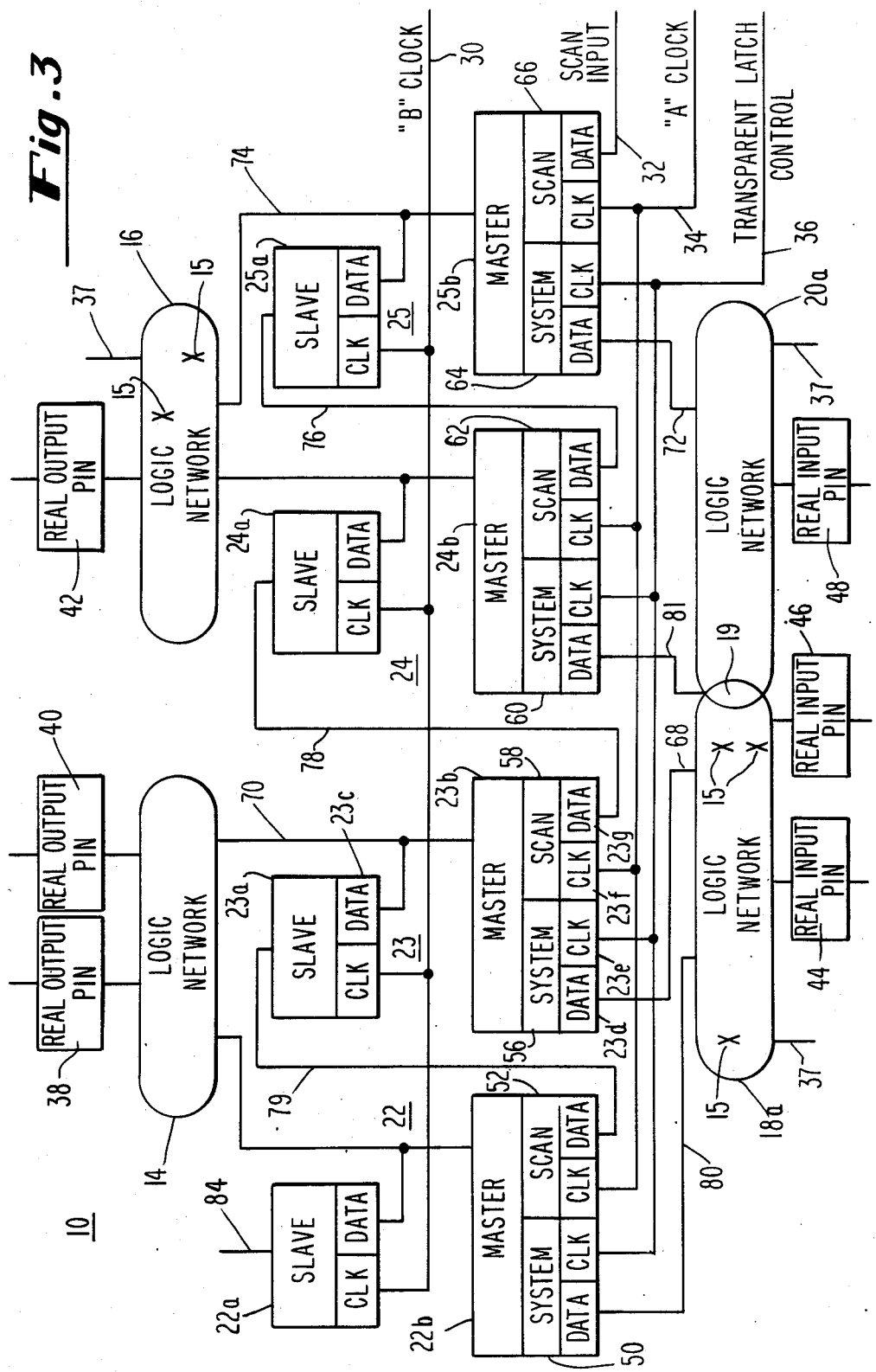
FIG. 3 shows a detailed view of the test system of FIG. 1.

Referring now to FIG. 3 there is shown a more detailed view of logic system 10. Each virtual pin 22-25 includes its respective slave latch 22a-25a and master latch 22b-25b. Each slave latch 22a-25a is clocked by B clock signal 30a. Each master latch 22b-25b is a conventional level sensitive latch combined with a data selector which can select data from one of two possible data inputs. Thus effectively each master latch 22b-25b contains two internal latches, a system latch clocked by transparent latch control signal 36a and a scan/set latch clocked by A clock signal 34a. To illustrate the operation of master latches 22b-25b and the other features of virtual pins 22-25, virtual pin 23 is examined as follows.

Virtual pin 23 comprises a slave latch 23a which is clocked by B clock 30a on B clock line 30 and a master latch 23b. Both slave latch 23a and master latch 23b are independent of logic networks 14, 16, 18a and 20a. Master latch 23b is clocked by A clock 34a on A clock line 34. Similarly, each of the remaining virtual pins 22, 24, 25 also has a respective slave latch 22a, 24a, 25a clocked by B clock 30a and a respective master latch 22b, 24b, 25b clocked by A clock 34a and each need not be described separately. Additionally, each is independent of logic networks 14, 16, 18a and 20 and 20a.

Slave latch 23a receives an input bit at data input 23c and latches this input bit in response to the B clock signal 30a on B clock line 30. Master latch 26b is a conventional latch combined with a data selector which can select data from line 23d if clock 23e is active or it can select data from line 23g if clock 23f is active. Thus effectively master latch 23b contains two internal latches, system latch 56 and scan/set latch 58. Either effective latch may receive and latch data in response to a pulse from its respective clock.

System latch 56 latches data applied to its data input 23d in response to a transparent latch control pulse 36b on transparent latch control line 36 at its clock input 23e. The other latch within master latch 23b, scan/set latch 58, latches data applied to data input 24g in response to the A clock signal 34a on A clock line 34 at its clock input 24f. Data latched by either system latch 56 or scan/set latch 58 of master latch 23b is presented to both data input 23c of slave latch 23a and to logic network 14 by line 70.

Master latch 23b is not able to latch data when transparent latch control line 36 is low because the data at data input 23d cannot be latched without a pulse at clock input 23e. Likewise, the master latches of virtual pins 22, 24 and 25 may not latch data when transparent latch control line 36 is low. Thus with transparent latch control line 36 low, scan/set testing can be performed.

During the test mode it is possible to receive data from logic networks 18a, 20a into virtual pins 22-25 in which logic networks 18a, 20a may include overlapping region 19 or may be independent as previously described for networks 18, 20. Line 81 couples overlapping region 19 to virtual pin 24. Test signals may originally be placed into logic networks 18, 20 through real input pins 44, 46 and 48. The signals ripple through networks 18, 20 to virtual pins 22-25 without system clock signal 37a if all the logic in networks 18a, 20a is purely combinatorial. If networks 18a, 20a contain sequential logic, a clock pulse, such as system clock pulse 37b, may be required to propogate the test signals through networks 18a, 20a to virtual pins 22-25.

To latch this data into virtual pin 23, a brief pulse 36b is applied on transparent latch control line 36 which clocks clock input 23e of master latch 56. This causes data from logic network 18a which is applied by line 68 to data input 23d to be latched into master latch 23b. This data, which appears at output line 70 of master latch 23b, is applied to logic network 14 and slave latch 23a.

Thus it is possible during the test mode for virtual pin 23 to receive and latch a signal from logic network 18a utilizing no logic circuits from either logic network 14 or 18a. Only the logic circuits of virtual pin 23 and transparent latch control 36 are required. In a similar manner, virtual pins 22, 24 and 25 latch data from networks 18a or 20a into latches 50, 60 and 64 respectively when pulse 36b is applied on control line 36. Furthermore, this latching is also completely independent of the system clock 37a which is required to run the logic networks during system mode.

For example, transparent latch control line 36 may be used to latch data from logic network 20a into virtual pin 25. When system 10 is in the test mode and latch control line 36 is low pulse 36a on latch control 36 causes system latch 64 within master latch 25b of virtual pin 25 to latch data from logic network 20a through line 72. The data latched into system latch 64 is applied to slave latch 25a and to logic network 16 by line 74.

In order to switch from test mode to system mode, transparent latch control signal 36a is brought to a high level causing all data presented to master latch 25b on line 72 to pass directly through master latch 25b to line 74 without any clocking signals being applied to latch 25b and to be applied to logic network 16. Thus when transparent latch control 36 is high, the equivalent circuit between lines 72 and 74 is a few gate delays. Virtual pin 25, as well as the remaining virtual pins, is thus transparent in the system mode. During system mode the system clock signal 37a controls operation of logic netorks 14, 16, 18a and 20a independently of A clock signal 34a, B clock signal 30a and latch control 36a which have external pins which are independent of the external pin of system clock signal 37a.

Returning now to the test mode, transparent latch control signal 36a is again brought to a low level and scan/set input data 32b as shown in FIG. 2 by conventional cross-hatching is applied to scan/set input data line 32. Scan/set input data 32b is a predetermined bit string which is used to test logic networks 14,16. Scan/set input data 32b is thus applied to master latch 25b of virtual pin 25. An A clock 34a pulse is applied on A clock line 34 causing scan/set latch 66 of master latch 25b to latch scan input data 32b, applied by scan input line 32. As noted previously, this latched data is applied by line 74 to both logic network 16 and slave 25a. However, in this case, a pulse is applied on B clock line 30 causing slave latch 25a to latch the data presented by master latch 25b on line 74. This latched data is applied on line 76 from slave 25a to scan/set latch 62 of master latch 24b within virtual pin 24.

When A clock line 34 is pulsed again, scan/set latch 62 of master latch 24b latches the data on line 76 and applies it to the data input of slave 24a. Simultaneously master latch 25b latches another bit from scan input signal 32a. B clock 30 is then pulsed causing slave latch 24a to latch the output of master latch 24b and apply it by line 78 to scan set latch 58 of master latch 23b within virtual pin 23. An additional set of pulses on clock lines 30, 34 causes virtual pin 23 to apply the data to virtual pin 22 on line 79. This alternating of A clock signal 34a and B clock signal 30a is shown as period 35 in FIG. 2.

Thus by providing scan input data 32b at scan input line 32 and alternately pulsing A clock line 34 and B clock line 30, the scan input data 32a may be shifted through the string of virtual pins 22-25 whereby virtual pins 22-25 act like a shift register and may be used to position a predetermined set of test signals with respect to logic networks 14,16 to test networks 14 and 16. The signals thus applied to networks 14 and 16 may be caused to propagate through networks 14, 16 and an output may be read at real output pins 38, 40 and 42 to detect faults within networks 14, 16. If buried sequential latches are present in networks 14, 16, a pulse on system clock line 37 may be necessary for these signals to propagate to real output pins 38, 40 and 42.

Additionally, test signals may be applied to logic networks 18a, 20a by real input pins 44, 46, 48 to test networks 18a, 20a. The signals received from real pins 44, 46, 48 progress through networks 18a, 20a and a resultant set of signals is applied by line 80 to virtual pin 22, line 68 to virtual pin 23, line 81 to virtual pin 24 and line 72 to virtual pin 25. System clock 37a is not required for signals to progress through networks 18a, 20a. if networks 18a, 20a are purely combinatorial. Clock pulse 37b must be supplied to networks 18a, 20a on line 37 if they contain any buried latches 15 so that the test signals may proceed through the sequential elements. When the test signals have propagated through networks 18a, 20a, a pulse 36b of short duration is applied on transparent latch control line 36 causing each of the virtual pins 22-25 to latch into its respective system latch within its respective master latch the signals on lines 80, 68, 81 and 72 which are the outputs of networks 18a, 20a.

These latched signals from networks 18a, 20a are applied to logic networks 14, 16 and a reading may be performed at real output pins 38, 40, 42. However, if transparent latch control 36a is held low and A clock 34a and B clock 30a are alternated as previously described for period 35, virtual pins 23-25 function as a shift register and the data received from networks 18a, 20a may be serially read at the scan output 84. Scan output pin 84 is electrically coupled to a dedicated external metal pin. The readings performed at pin 84 may be used to test logic networks 18a, 20a.

System 10 thus requires five extra external pins in addition to the external pins required to perform normal system functions. These overhead pins are for A and B clocks 34, 30, latch control 37, scan input 32, and scan output 84. This overhead is necessary to improve the testability of system 10.

Thus while in the test mode different tests may be performed. These tests are performed under the control of transparent latch control 36a, A clock 34a, and B clock 30a independently of system clock 37a. By holding the transparent latch control signal 36a low and alternating the clocks 30a, 34a a predetermined set of test data signals 32b applied at scan input 32 may be shifted through virtual pins 22-25 and thereby applied to logic networks 14, 16, in order to test logic networks 14, 16 by reading the resultant signals at real output pins 38, 40, 42.

Alternately, a pulse 36b of short duration on transparent latch control line 36 may be used to latch data from logic networks 18a, 20a, and this latched data may be shifted out to scan output 84 by alternating A clock 34a and B clock 30a. The output at scan output 84 may be used to diagnose faults in networks 18a, 20a. The latched data may also be applied to logic networks 14, 16. In order to switch from the test mode to the system mode wherein virtual pins 22-25 become transparent and the networks 14, 16, 18a, 20a perform their system functions under the control of the independent system clock 37a, transparent latch control 36a is held high.

All test mode operations and the switching between test and system modes are controlled by a single control, latch control 36a, independently of system clock signal 37a. Latch control signal 36a is applied on latch control line 36 which is an independent line, electrically coupled to an independent external pin. In particular, the external pin of latch control line 36 is independent of the external pin of system clock line 37.

Figure 4:
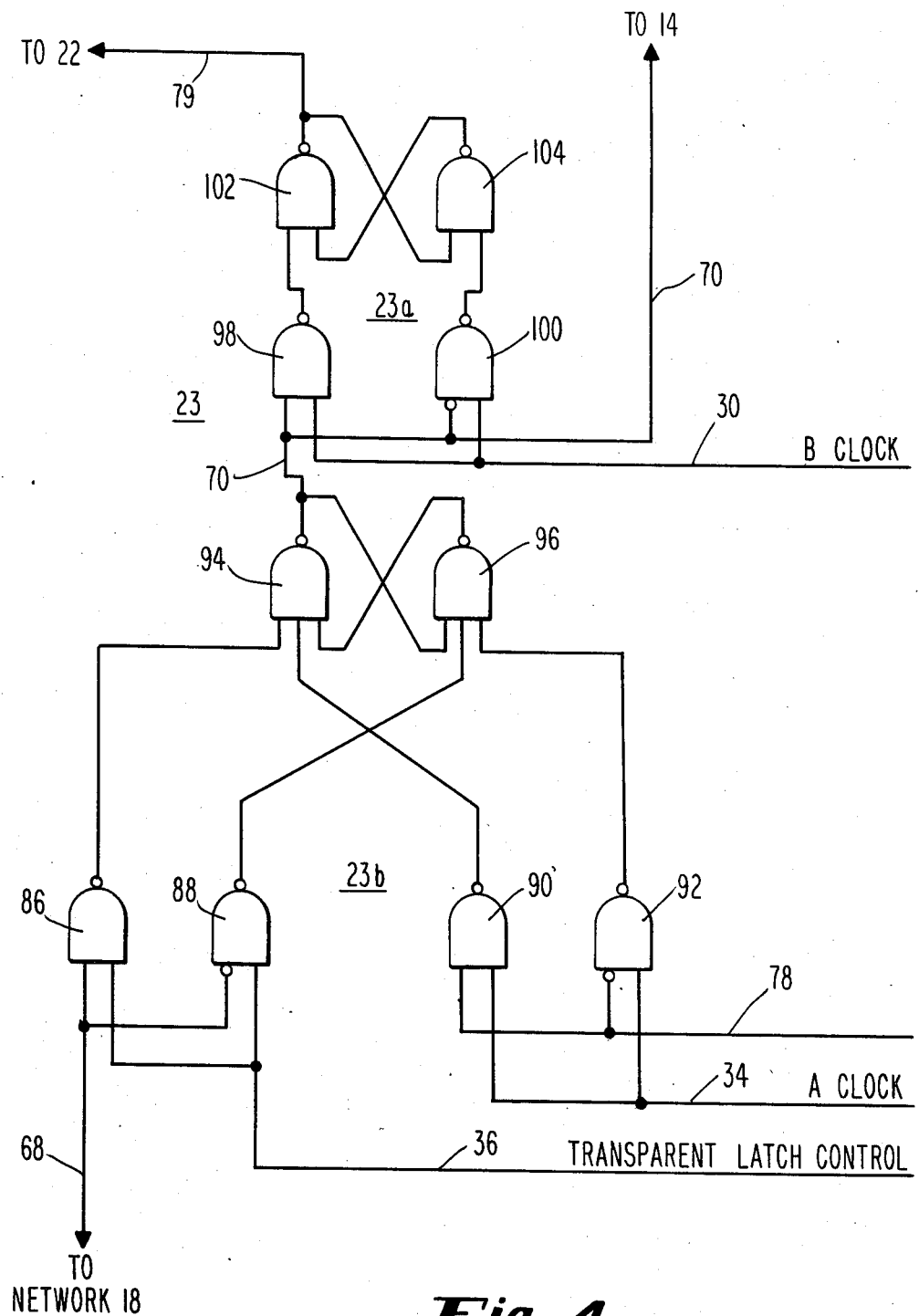
FIG. 4 shows a gate level diagram of the virtual pins of the test system of FIG. 1.

FIG. 4 shows a detailed gate level diagram of virtual pin 23. It will be understood that the gate level configuration of virtual pin 23 is identical to that of virtual pins 22, 24 and 25. Further, the master and slave latches may be formed having a variety of gate configurations. Virtual pin 23 comprises master latch 23b and slave latch 23a. Master latch 23b includes NAND gates 86, 88, 90, 92, 94, 96 which are all independent of and not included in logic network 18 or network 18a.

In order to place system 10 into the system mode, transparent latch control line 36 is held high, causing a high input to be applied to NAND gates 86, 88. If A clock 34 is held low, the signal from network 18 applied on line 68 to gate 86 appears at the output 70 of gate 94 two gate delays later. Gates 86 and 94 act essentially as inverters and data from network 18 may ripple through to line 70. Thus data from network 18 may be applied by way of output 70 directly to network 14 and virtual pin 23 is effectively transparent.

When transparent latch control 36 is low, a low signal is applied to NAND gates 86, 88. This prevents data on line 68 from being latched into master latch 23b unless a pulse 36b is applied to gates 86, 88. If A clock line 34 is active clocking pulses are applied to gates 90, 92 causing data on line 78 to be latched and retained by gates 94, 96 which form a conventional NAND-NAND cross-coupled pair. The data on line 78, which is now latched by latch 23b, was applied by scan input line 38 to virtual pin 25 and has been shifted through virtual pins 25, 24.

The output of gate 94 is applied by line 70 to gates 98, 100 which form the input of slave latch 23a. When B clock line 30 is pulsed the output of gate 94 is latched and retained by the NAND-NAND cross-coupled pair formed by gates 102, 104. The output of gate 102 is coupled by line 79 to scan/set latch 52 of pin 22. Thus virtual pin 22 may receive the data applied to virtual pin 23 on the next pulse of A clock 34a.

While this invention has been described with reference to particular embodiments thereof, it is not limited thereto. Instead, the appended claims are intended to be construed to encompass not only those forms of the invention illustrated and described, but to such other forms and variations thereof as may be devised by those skilled in the art without departing from the true spirit and scope of this invention.

For example, in another embodiment (not shown) the logic of a logic circuit on a semiconductor chip may be unpartitioned and the virtual pins may be external to the chip. In such an embodiment only external real pins may serve as testing sites. There are no internal virtual pins present in the logic circuit being tested.

Additionally, the virtual pins of the present invention may be used in a logic circuit which also contains other types of virtual pins including conventional scan/set virtual pins. In such a combination, for example, a first logic network may be coupled to a second logic network by a virtual pin of the present invention and the second logic network may be coupled to a third logic network by conventional scan/set latches.

We claim:

1. For use in a logic system having a system clock and switchable between a system mode and a test mode, the logic system having at least first and second semiconductor logic networks for performing system logic functions during the system mode test system comprising:

test signal means for applying a test signal to the first logic network, control signal means independent of the system clock for producing first, second and third control signals, virtual pin means coupled between and providing a site for testing of the first and second logic networks during the test mode and free of logic circuits common to the first and second logic networks and performing no system logic functions while the logic system is in the system mode, a single control line indepedent of clock signals for applying all of the control signals of the control means to the virtual pin means independently of the system clock, and said virtual pin means including means for switching to the test mode in response to said first control signal, said switching means including means for storing the test signal from the first logic network in response only to said second control signal, said switching means for switching the logic system to the system mode in response to said third control signal and maintaining the system mode during cycling of the system clock whereby the first logic network is coupled to the second network through an effectively transparent and inactive virtual pin means performing no system logic functions.

2. The system of claim 1 in which there is provided a string of virtual pin means, means for applying first and second clock signals to the string of virtual pin means, scan data means for producing test data signals, means for shifting the test data signals in sequence through the string of virtual pin means in response to the first and second clock signals whereby the test data signals are transmitted through the second logic network.

3. The system of claim 2 in which the virtual pin means includes first and second latch means respectively coupled to the means for applying said first and second clock signals, the second latch means including the switching means free of logic circuits common to the first and second networks.

4. The system of claim 3 in which there is provided means directly coupling the switching means to the second logic network for applying test data signals from the virtual pin means to the second logic network when a test signal from the first logic network is received and when the test data signals are transmitted.

5. The system of claim 2 in which the string has a first end for receiving the test data signals and a second end for reading signals shifted through the string.

6. The system of claim 1 in which there is further provided means for holding the system clock in an inactive state during the test mode and during the time of the first and second control signal.

7. The system of claim 1 in which the first and second networks are partitioned by a plurality of virtual pins in which the virtual pins are positioned independently of latches within the first and second networks.

8. The system of claim 1 in which there is provided means for directly coupling the first logic network to the switching means and means for directly coupling the control signal means to the switching means.

9. The system of claim 1 in which at least one logic network includes sequential logic.

10. A method for testing a logic system having a system clock and partitioned into first and second semiconductor logic networks independently of the position and number of latches in the first and second networks and in which the logic system is switchable between a system mode and a test mode comprising the steps of:

(a) applying a test signal to the first logic network,
    (b) producing first, second and third control signals independently of the system clock,
    (c) coupling virtual pin means between and providing a site for testing of the first and second logic networks in which the virtual pin means are free of logic circuits common to the first and second logic networks,
    (d) applying by way of a single control line independent of clock signals all of the control signals to the virtual pin means independently of the system clock,
    (e) switching the test systems to the test mode in response to the first control signal and storing a test signal from the first logic network in the virtual pin means in response only to the second control signal, and
    (f) switching the test system to the system mode in response to the third control signal and maintaining the system mode during cycling of the system clock whereby the first network is coupled to the second network through an effectively transparent and inactive virtual pin means which performs no system logic functions while the logic system in in the system mode.

11. The method of claim 10 in which step (c) includes the additional steps of:

providing a string of virtual pin means and applying first and second clock signals to the string of virtual pin means, and providing test data signals and shifting the test data signals in sequence through the string of virtual pin means in response to the first and second clock signals whereby the test data signals are transmitted through the second logic network.

12. The method of claim 11 including holding the system clock in an inactive state during the test mode and during the time of the first and second control signals.

13. The method of claim 11 including partitioning the first and second networks by a plurality of virtual pins in which the pins are partitioned independently of latches within the first and second networks.

14. The method of claim 10 in which step (a) includes the step of applying the test signal to a network said network including sequential logic and applying a system clock signal to the sequential logic for permitting the test signal to propagate through the sequential logic.

* * * * *